(12) United States Patent
Chakraborty et al.

(10) Patent No.: US 9,385,087 B2
(45) Date of Patent: Jul. 5, 2016

(54) POLYSILICON RESISTOR STRUCTURE HAVING MODIFIED OXIDE LAYER

(71) Applicant: GLOBALFOUNDRIES INC., Grand Cayman (KY)

(72) Inventors: Debarsi Chakraborty, Bangalore (IN); Aveek N. Chatterjee, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 141 days.

(21) Appl. No.: 14/057,084

(22) Filed: Oct. 18, 2013

(65) Prior Publication Data

US 2015/0108608 A1 Apr. 23, 2015

(51) Int. Cl.
*H01L 23/538* (2006.01)
*H01L 49/02* (2006.01)
*H01L 23/522* (2006.01)

(52) U.S. Cl.
CPC ........ *H01L 23/5384* (2013.01); *H01L 23/5228* (2013.01); *H01L 28/20* (2013.01); *H01L 2924/0002* (2013.01)

(58) Field of Classification Search
CPC .. H01L 28/20; H01L 23/5384; H01L 23/5228
See application file for complete search history.

(56) References Cited

U.S. PATENT DOCUMENTS

| | | | |
|---|---|---|---|
| 4,107,515 A | 8/1978 | Kulwicki | |
| 5,640,137 A | 6/1997 | Mantha | |
| 6,096,584 A | 8/2000 | Ellis-Monaghan et al. | |
| 7,154,370 B2 | 12/2006 | Szwarc et al. | |
| 7,278,201 B2 | 10/2007 | Szwarc et al. | |
| 7,332,794 B1 | 2/2008 | Foote | |
| 8,212,649 B2 | 7/2012 | Fujiwara et al. | |
| 8,421,128 B2 | 4/2013 | Abou-Khalil et al. | |
| 2002/0008302 A1 | 1/2002 | Singh et al. | |
| 2006/0049484 A1 | 3/2006 | Nomura | |
| 2006/0194436 A1 | 8/2006 | Oh et al. | |
| 2006/0238292 A1 | 10/2006 | Beach et al. | |
| 2009/0061237 A1* | 3/2009 | Gates ................ | C23C 16/30 428/446 |
| 2009/0325364 A1* | 12/2009 | Sasagawa ......... | H01L 21/76254 438/458 |
| 2010/0242592 A1* | 9/2010 | Haneef ............... | G01F 1/6845 73/204.26 |
| 2012/0139078 A1* | 6/2012 | Malm ................ | 257/467 |
| 2012/0313215 A1 | 12/2012 | Lukaitis et al. | |

OTHER PUBLICATIONS

"High Performance SOI-CMOS Wall Shear Stress Sensors", authors by Ibraheem Haneef, Syed Zees han Ali, Florin Udrea, John D. Coull, Howard P. Howard P. Hodson, Department of Engineering, University of Cambridge, Cambridge, UnitedKingdom; IEEE Sensors 2007 Conference.*

(Continued)

*Primary Examiner* — Eva Y Montalvo
*Assistant Examiner* — Nga Doan
(74) *Attorney, Agent, or Firm* — Michael LeStrange; Hoffman Warnick LLC

(57) ABSTRACT

Various embodiments include resistor structures. Particular embodiments include a resistor structure having multiple oxide layers, at least one of which includes a modified oxide. The modified oxide can aid in controlling the thermal capacitance and the thermal time constant of the resistor structure, or the thermal dissipation within the resistor structure.

17 Claims, 3 Drawing Sheets

(56) References Cited

OTHER PUBLICATIONS

"Temperature Gated Thermal Rectifier for Active Heat Flow Control", Authors by Jia Zhu, Kedar Hippalgaonkar, Sheng Shen, Kevin Wang, Yohannes Abate, Sangwook Lee, Junqiao Wu, Xiaobo Yin, Arun Majumdar, Xiang Zhang; Nano Letters 2014.*

Ju et al., "Process-dependent thermal transport properties of silicon-dioxide films deposited using low-pressure chemical vapor deposition", Journal of Applied Physics, vol. 85, No. 10, May 15, 1999.

* cited by examiner

POLYSILICON RESISTOR STRUCTURE HAVING MODIFIED OXIDE LAYER

FIELD

The subject matter disclosed herein relates to integrated circuits. More particularly, the subject matter relates to resistor structures in integrated circuits.

BACKGROUND

As devices relying upon integrated circuits (ICs) have increased in complexity and functionality, those devices have required ever more dynamic ICs to meet the demands of those device users. Polysilicon resistors have been used in many IC structures to provide effective resistance function at lower cost than conventional resistor structures. However, polysilicon resistors may have a high sheet resistance, and joule heating of these resistors can negatively impact circuit performance and increase the chances of metal electro-migration wear-out.

Conventional approaches to reduce joule heating in polysilicon resistors include optimizing placement of through-silicon-vias (TSVs) and circuit floor planning to reduce heating effects in the circuit. However, TSVs have inherent trade-offs, for example, they increase the complexity of circuit formation and processing, and also increase costs.

Other conventional approaches include using micro-channels for liquid cooling. These micro-channels provide a conduit for cooling fluid to reduce heating in the resistor structure. However, micro-channels also suffer from drawbacks, for example, they can be unreliable (e.g., due to leakage), increase processing and fabrication costs and complexity, and may be difficult to calibrate precisely.

BRIEF DESCRIPTION

Various embodiments include resistor structures including a modified oxide layer. One embodiment includes a resistor structure having: a first oxide layer; a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein at least one of the first oxide layer or the second oxide layer includes a modified oxide for controlling at least one of a resistance of the resistor structure or a thermal dissipation within the resistor structure.

A first aspect includes a resistor structure having: a first oxide layer; a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein at least one of the first oxide layer or the second oxide layer includes a modified oxide for controlling at least one of a resistance of the resistor structure or a thermal dissipation within the resistor structure.

A second aspect includes a resistor structure having: a first oxide layer including silicon dioxide ($SiO_2$); a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein the second oxide layer includes a modified oxide for controlling at least one of a resistance of the resistor structure or a thermal dissipation within the resistor structure.

A third aspect includes a resistor structure having: a first oxide layer; a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer including silicon dioxide ($SiO_2$) and overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein the first oxide layer includes a modified oxide for controlling at least one of a resistance of the resistor structure or a thermal dissipation within the resistor structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
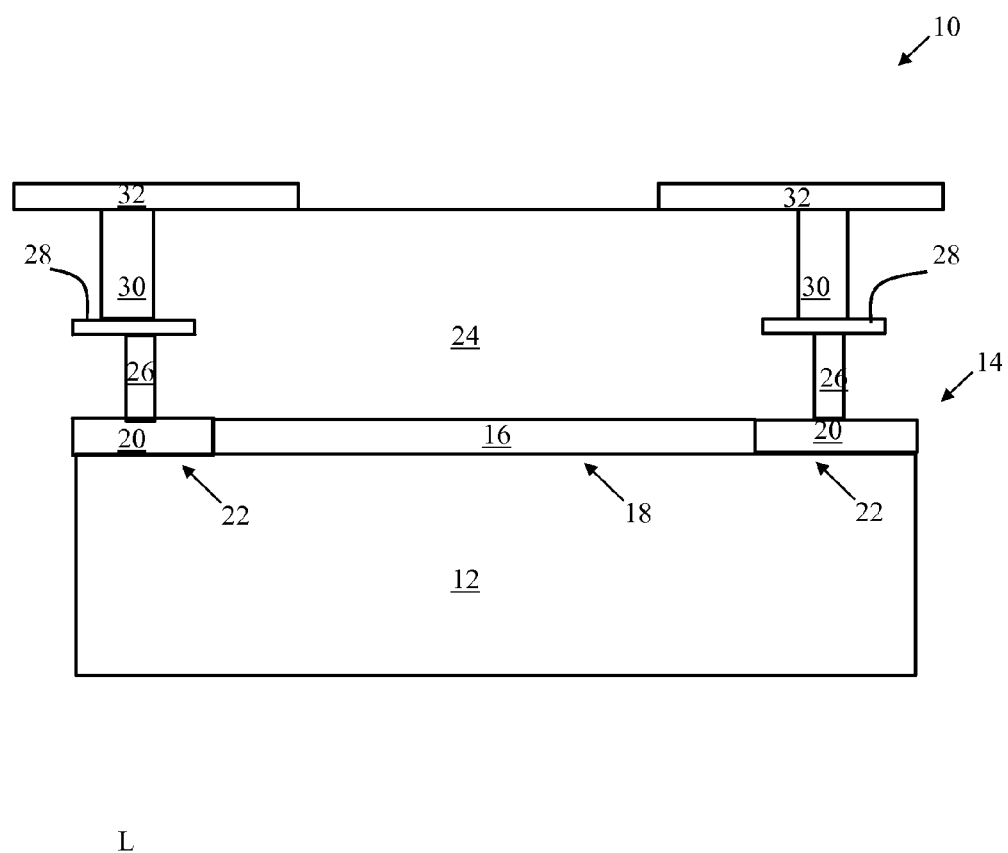
FIG. 1 shows a cross-sectional schematic view of a resistor structure according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits. More particularly, the subject matter relates to resistor structures in integrated circuits.

As described herein, conventional approaches to reduce joule heating in polysilicon resistors include optimizing placement of through-silicon-vias (TSVs) and circuit floor planning to reduce heating effects in the circuit. However, TSVs have inherent trade-offs, for example, they increase the complexity of circuit formation and processing, and also increase costs.

Other conventional approaches include using micro-channels for liquid cooling. These micro-channels provide a conduit for cooling fluid to reduce heating in the resistor structure. However, micro-channels also suffer from drawbacks, for example, they can be unreliable (e.g., due to leakage), increase processing and fabrication costs and complexity, and may be difficult to calibrate precisely.

Various embodiments include a resistor structure having a modified oxide layer causing reduced heating and diminished variation in resistance as compared with conventional resistor structures. The resistor structures shown and described herein can be particularly useful in alternating current (AC) applications.

As described herein, the term "modified oxide" includes an oxide including silicon dioxide ($SiO_2$) and an OH group that passivates the SiO2 bonds. In various embodiments, as described herein, the thermal time constant (frequency) of the modified oxide can be tuned by controlling the OH concentration in the modified oxide. This OH concentration can be tuned by choice of: deposition/oxidation method, e.g., application of phosphosilicate glass (PSG), low-pressure chemical-vapor-deposition (LPCVD), evaporation, wet thermal oxidation; oxidation temperature; and/or deposition temperature. Further, the thermal time constant (frequency of material) can be tuned by changing the thickness of the modified oxide layer.

Some particular embodiments include a resistor structure having: a first oxide layer; a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein at least one of the first oxide layer or the second oxide layer includes a modified oxide for controlling at least one of a resistance of the resistor structure or a thermal dissipation within the resistor structure.

Other particular embodiments include a resistor structure having: a first oxide layer including silicon dioxide (SiO2); a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein the second oxide layer includes a modified oxide for controlling at least one of a resistance of the resistor structure or a thermal dissipation within the resistor structure.

Various additional embodiments include a resistor structure having: a first oxide layer; a first lateral contact layer overlying the first oxide layer, the first lateral contact layer including: a polysilicon region overlying a first portion of the first oxide layer; and at least one contact region coplanar with the polysilicon region and overlying a second portion of the first oxide layer distinct from the first portion of the first oxide layer; a second oxide layer including silicon dioxide (SiO2) and overlying the first lateral contact layer; a first via contacting the at least one contact region and contacting the second oxide layer; a first contact pad overlying the first via and contacting the second oxide layer; a second via contacting the first contact pad and contacting the second oxide layer; and a second contact pad overlying the second via and the second oxide layer, wherein the first oxide layer includes a modified oxide for controlling at least one of a resistance of the resistor structure or a thermal dissipation within the resistor structure.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

In various embodiments, the resistor structures shown and described herein is selected from the group consisting of: a polysilicon resistor with a serpentine shape; a silicon resistor structure with multiple bars connected in series; silicon resistor structure with multiple bars connected in parallel; and an active semiconductor device subjected to joule heating.

FIG. 1 shows a cross-sectional view of a resistor structure 10 according to various embodiments. As shown, the resistor structure 10 can include a first oxide layer 12, which in some cases as described herein, can include silicon dioxide ($SiO_2$) or a modified oxide such as a doped silicon-on-insulator (SOI) oxide material. In various embodiments, the first oxide layer 12 can have a thickness of approximately 2 microns. In various embodiments, the first oxide layer 12 has a length along (L) axis of greater than 100 microns.

Overlying the first oxide layer 12 is a first lateral contact layer 14. The first lateral contact layer 14 can include a polysilicon region 16 overlying a first portion 18 of the first oxide layer 12, and at least one contact region 20 coplanar with the polysilicon region 16 and overlying a second portion 22 of the first oxide layer 12. The second portion 22 is distinct from the first portion 18 of the first oxide layer 12, and in some cases, the at least one contact region 20 includes one or more contact regions surrounding the polysilicon region 16 overlying the first oxide layer 12. As noted herein, the contact region(s) 20 are coplanar with the polysilicon region 16, meaning that these regions have approximately a same thickness and are aligned at the same depth within the resistor structure 10. In various embodiments, the at least one contact region 20 includes Nickel Silicide (NiSi).

Overlying the first lateral contact layer 14 is a second oxide layer 24. The second oxide layer 24 can include $SiO_2$ or a modified oxide such as a doped silicon-on-insulator (SOI) oxide material including an OH group. As described herein, at least one of the first oxide layer 12 or the second oxide layer 24 includes a modified oxide for controlling at least one of a resistance of the resistor structure or a thermal dissipation within the resistor structure 10. In some cases, both of the first oxide layer 12 and the second oxide layer 24 include a modified oxide and are both designed to control at least one of a resistance of the resistor structure or a thermal dissipation within the resistor structure 10. In various embodiments, the second oxide layer 24 has a length along the (L) axis that is less than the first oxide layer 12. That is, the first oxide layer 12 has a larger footprint within the resistor structure than the second oxide layer 24. In some cases, the second oxide layer 24 has a thickness of approximately 5 microns.

The resistor structure 10 can also include at least one first via 26 contacting the at least one contact region 20 and contacting the second oxide layer 24 (e.g., along a sidewall of the second oxide layer 24). In various embodiments, the first via 26 includes tungsten (W). In some cases, more than one first via 26 is present, with each contacting a contact region 20. The resistor structure 10 can also include at least one first contact pad 28 overlying the first via 26 and contacting the second oxide layer 24 (e.g., along a sidewall of the second oxide layer 24). In some cases, the first contact pad(s) 28 can include copper, and can have an aspect ratio of greater than approximately 5 and less than approximately 150.

Overlying the first contact pad(s) 28 is at least one second via 30, contacting the first contact pad 28 and the second oxide layer 24 (e.g., along a sidewall of the second oxide layer 24). The second via(s) 30 can include tungsten (W) in some cases. A second contact pad 32 overlies the second via 30 and the second oxide layer 24. In some cases, the second contact pad(s) 32 can include gold, and can have an aspect ratio of greater than approximately 5 and less than approximately 100, and in some cases, the aspect ratio of the second contact pad(s) 32 is less than the aspect ratio of the first contact pad(s) 28.

As described herein, the resistor structure 10 can be particularly effective in alternating current (AC) applications. In some cases, the resistor structure 10 has a thermal capacitance that is greater than conventional resistor structures, which increases the thermal time constant of the structure. Additionally, the greater thermal capacitance leads to less variation in resistance as a function of applied voltage (or forced current). In this respect, the resistor structure 10 can have a constant resistance as a function of applied voltage. That is, as the voltage applied to resistor structure 10 changes, the resistance of the resistor structure 10 can remain constant.

Various additional embodiments include a method of forming a polysilicon resistor structure. In various embodiments, the method can include:

P1: depositing a thin oxide over a silicon-on-insulator (SOI) substrate;

P2: lithographically forming n-well regions;

P3: ion implanting the n-wall regions to create n-doped wells;

P4: removing masking layers (photoresist) and oxidized regions after ion implanting. This process can include annealing such as rapid thermal annealing (RTA) to repair damaged portions of the substrate;

P5: forming a channel region. This process can include creating a stack of deposited oxide, silicon nitride, and a positive photoresist. The process can further include lithographically sequencing to implant the channel region at a desired footprint and depth;

P6: removing the photoresist after forming the channel region, and depositing a thick field oxide;

P7: removing the protective silicon nitride layer and a thin oxide layer to expose the active area of the device;

P8: depositing a gate oxide;

P9: adjusting an implanting/doping amount of the gate oxide after deposition of the gate oxide;

P10: creating a polysilicon layer by depositing the polysilicon layer over the gate oxide;

P11: depositing a negative photoresist, and performing photolithography on the polysilicon layer using an N-type source/drain mask;

P12: n-type implanting the polysilicon layer;

P13: removing the negative photoresist;

P14: performing a photolithography sequence using a p-type source/drain mask and ion implantation; and P15: removing the p-type source/drain mask after ion implanting.

Additional processes can be performed at the back-end-of-line, as is known in the art.

Figure 2:
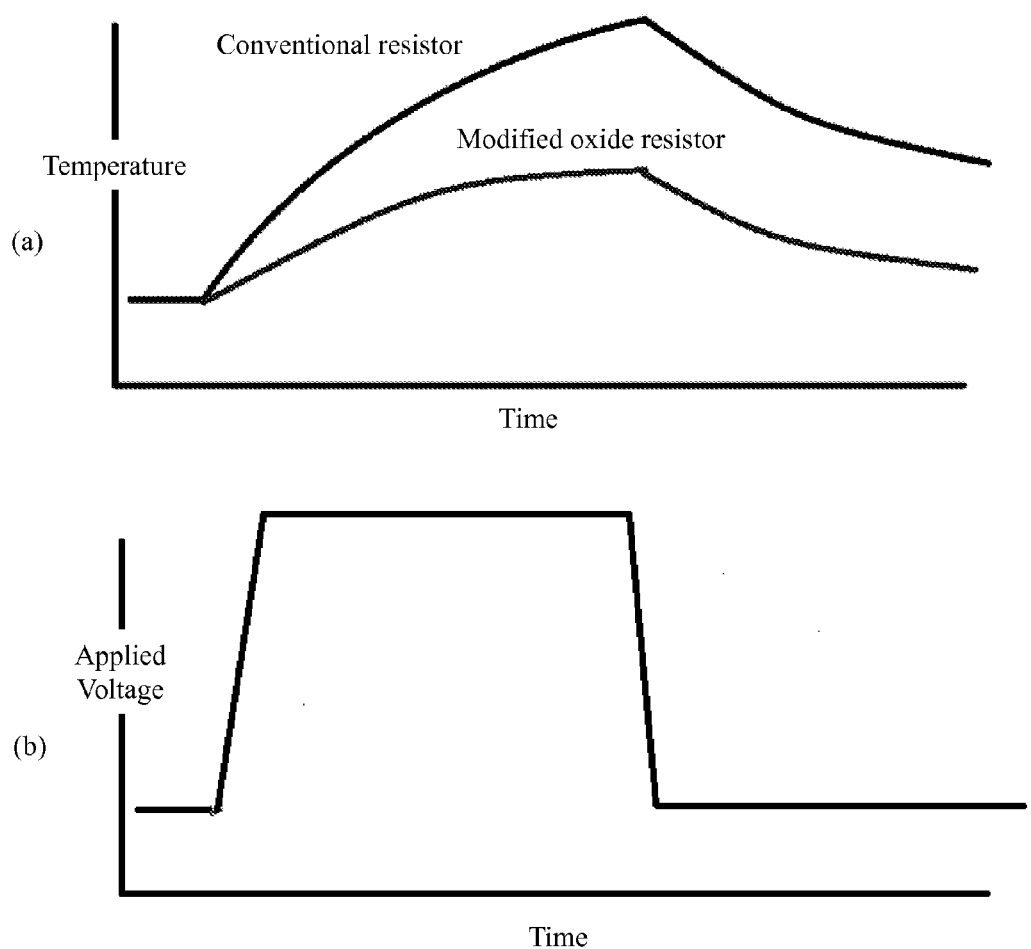
FIG. 2 shows: (a) a resistance v. time graph depicting a conventional resistor as compared with a modified oxide resistor structure according to various embodiments; and (b) an applied voltage v. time graph for the time illustrated in part (a).

FIG. 2 shows two graphical depictions illustrating various aspects of the invention. More particularly, FIG. 2(a) shows a resistance v. time graph depicting a conventional resistor as compared with a modified oxide resistor structure according to various embodiments. As shown, over time, the modified oxide resistor structures shown and described herein can have a lower resistance variation over time as compared with a conventional resistor. FIG. 2(b) shows an applied voltage v. time graph for the time illustrated in part (a).

Figure 3:
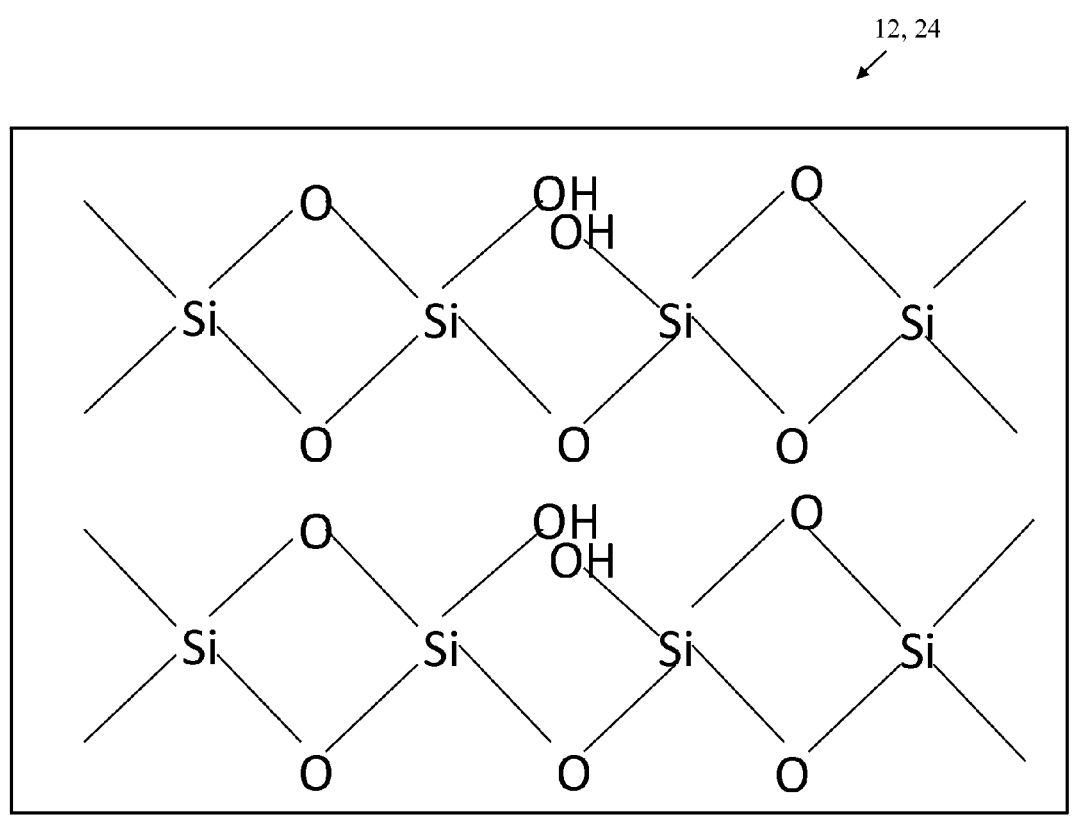
FIG. 3 shows a schematic illustration of a modified oxide composition according to various embodiments.

FIG. 3 shows a schematic illustration of a modified oxide composition according to various embodiments. As described herein, at least one of the first oxide layer 12 or the second oxide layer 24 can include $SiO_2$ or a modified oxide such as a doped silicon-on-insulator (SOI) oxide material including an OH group. As described herein, at least one of the first oxide layer 12 or the second oxide layer 24 includes a modified oxide for controlling the thermal capacitance and the thermal time constant of the resistor structure 10 or the thermal dissipation within the resistor structure 10 (FIG. 1).

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A resistor structure comprising:
a first oxide layer;
a first lateral contact layer overlying the first oxide layer, the first lateral contact layer including:
a polysilicon region overlying a first portion of the first oxide layer; and
at least one contact region coplanar with the polysilicon region and overlying a second portion of the first oxide layer distinct from the first portion of the first oxide layer;
a second oxide layer overlying the first lateral contact layer;
a first via contacting the at least one contact region and contacting the second oxide layer;
a first contact pad overlying the first via and contacting the second oxide layer;
a second via contacting the first contact pad and contacting the second oxide layer; and
a second contact pad overlying the second via and the second oxide layer,
wherein at least one of the first oxide layer or the second oxide layer includes a modified oxide for controlling at least one of a resistance of the resistor structure or a thermal dissipation within the resistor structure,
the modified oxide including a silicon-on-insulator (SOI) oxide material including an OH group.

2. The resistor structure of claim 1, wherein the at least one contact region includes nickel silicide (NiSi).

3. The resistor structure of claim 1, wherein at least one of the first via or the second via includes tungsten.

4. The resistor structure of claim 1, wherein the first contact pad includes copper.

5. The resistor structure of claim 1, wherein both of the first oxide layer and the second oxide layer include the modified oxide.

6. The resistor structure of claim 1, wherein the second contact pad includes gold.

7. The resistor structure of claim 1, wherein the first contact pad has an aspect ratio greater than approximately 5 and less than approximately 150.

8. The resistor structure of claim 7, wherein the second lateral contact layer has an aspect ratio greater than approximately 5 and less than approximately 100, and less than the aspect ratio of the first contact pad.

9. The resistor structure of claim 1, wherein the first oxide layer has a thickness of approximately 2 microns.

10. The resistor structure of claim 9, wherein the second oxide layer has a thickness of approximately 5 microns.

11. A resistor structure comprising:
a first oxide layer including silicon dioxide ($SiO_2$);
a first lateral contact layer overlying the first oxide layer, the first lateral contact layer including:
a polysilicon region overlying a first portion of the first oxide layer; and
at least one contact region coplanar with the polysilicon region and overlying a second portion of the first oxide layer distinct from the first portion of the first oxide layer;
a second oxide layer overlying the first lateral contact layer;
a first via contacting the at least one contact region and contacting the second oxide layer;
a first contact pad overlying the first via and contacting the second oxide layer;
a second via contacting the first contact pad and contacting the second oxide layer; and
a second contact pad overlying the second via and the second oxide layer,
wherein the second oxide layer includes a modified oxide for controlling at least one of a resistance of the resistor structure or a thermal dissipation within the resistor structure,
the modified oxide including a silicon-on-insulator (SOI) oxide material including an OH group,
wherein the resistor structure is selected from the group consisting of: a silicon resistor structure with multiple bars connected in series; silicon resistor structure with multiple bars connected in parallel; and an active semiconductor device subjected to joule heating.

12. The resistor structure of claim 11, wherein both of the first oxide layer and the second oxide layer include the modified oxide.

13. The resistor structure of claim 11, wherein the second contact pad includes gold.

14. The resistor structure of claim 11, wherein the first contact pad has an aspect ratio of greater than approximately 5 and less than approximately 150.

15. The resistor structure of claim 14, wherein the second lateral contact layer has an aspect ratio greater than approximately 5 and less than approximately 100, and less than the aspect ratio of the first contact pad.

16. The resistor structure of claim 11, wherein the first oxide layer has a thickness of approximately 2 microns, and wherein the second oxide layer has a thickness of approximately 5 microns.

17. A resistor structure comprising:
a first oxide layer;
a first lateral contact layer overlying the first oxide layer, the first lateral contact layer including:
a polysilicon region overlying a first portion of the first oxide layer; and at least one contact region coplanar with the polysilicon region and overlying a second portion of the first oxide layer distinct from the first portion of the first oxide layer;
a second oxide layer including silicon dioxide ($SiO_2$) and overlying the first lateral contact layer;
a first via contacting the at least one contact region and contacting the second oxide layer;
a first contact pad overlying the first via and contacting the second oxide layer;
a second via contacting the first contact pad and contacting the second oxide layer; and
a second contact pad overlying the second via and the second oxide layer,
wherein the first oxide layer includes a modified oxide for controlling at least one of a resistance of the resistor structure or a thermal dissipation within the resistor structure,
the modified oxide including a silicon-on-insulator (SOI) oxide material including an OH group.

* * * * *